United States Patent

Ikeda et al.

[11] Patent Number: 5,318,840
[45] Date of Patent: Jun. 7, 1994

[54] WEAR RESISTANT COATING FILMS AND THEIR COATED ARTICLES

[75] Inventors: Tsutomu Ikeda, Akashi; Toshiki Satoh, Kobe, both of Japan

[73] Assignee: Kabushiki Kaisha Kobe Seiko Sho, Kobe, Japan

[21] Appl. No.: 9,955

[22] Filed: Jan. 27, 1993

[51] Int. Cl.$^5$ ............................................. B32B 7/02
[52] U.S. Cl. ................................. 428/336; 428/472; 428/697; 428/698; 428/699; 428/704; 51/295; 51/307; 51/309
[58] Field of Search ............... 428/697, 698, 699, 704, 428/336, 472; 51/295, 307, 309

[56] References Cited

U.S. PATENT DOCUMENTS

| | | | |
|---|---|---|---|
| 4,237,184 | 12/1980 | Yonseth et al. | 428/336 |
| 4,239,536 | 12/1980 | Yamamoto et al. | 75/238 |
| 4,540,596 | 9/1985 | Nimmagadda | 427/37 |
| 4,734,339 | 3/1988 | Schachner et al. | 428/699 |
| 4,835,062 | 5/1989 | Holleck | 428/472 |
| 4,895,770 | 1/1990 | Schintlmeister et al. | 428/698 |

FOREIGN PATENT DOCUMENTS 57-192259 11/1982 Japan .

OTHER PUBLICATIONS

Quinto et al "High Temperature Microhardness of Hard Coatings Produced by Physical and Chemical Vapor Deposition" Thin Solid Films, 153 (1987) pp. 19–36.

English translation of JP 62–56564 Mar. 12, 1987.

*Primary Examiner*—A. A. Turner
*Attorney, Agent, or Firm*—Oblon, Spivak, McClelland, Maier & Neustadt

[57] ABSTRACT

Disclosed is a wear resistant boronitride film layer having a chemical composition of $(Al_xTi_{1-x})(B_yN_{1-y})$, where $0.05 < x < 0.75$, and $0.02 < y < 0.12$. The film layer is coated on the surface of a substrate to a thickness of 0.5 to 8 μm. With this construction, it is possible to obtain films superior in wear resistance to $(Al_xTi_{1-x})N$ films. Further, the substrates coated with the films include a WC based super hard alloy, TiCN-based cermet, and a ceramic.

2 Claims, 2 Drawing Sheets

WEAR RESISTANT COATING FILMS AND THEIR COATED ARTICLES

BACKGROUND OF THE INVENTION

1. Field of the Invention

This invention relates to particularly superior hard films and more particularly, it is concerned with anti-wear material coated articles which comprise, as substrate, a cutting tool or the like made of tungsten carbide or cermet or ceramic.

2. Description of the Prior Art

Coating the surfaces of high speed tool-steel tools, cemented carbide tools and the like with titanium-based nitride or carbide having hardness in order to improve properties such as wear resistance is a well-known technique.

Films of TiN or TiC, deposited by means of ion-plating method, are generally used as the wear resistant coatings for the cutting tools or the like. In particular the TiN film has been widely used in practice because it exhibits high oxidation resistance compared to the TiC film. Namely, the TiN films are superior in heat resistance to the TiC films and thus the TiN coated on the surface of the inserts prevents the film from further oxidation, such oxidation being manifested by crater depth at the high temperatures induced by the cutting operations. On the other hand, the film hardness of TiC is greater than that of TiC films are superior, in terms of the width of flank wear, to the TiN films. Recently there has been a need to further increase the cutting speed of tools under increasingly severe conditions. The conventional films, such as the TiN films described above have difficulty in meeting these needs. Further, as the films have excellent heat resistance and hardness properties, films of (Ti, Al)N, (Ti, Hf)N and the like, formed by ion-plating or sputtering have been proposed.

The (Ti, Al)N and (Ti, Hf)N films, however, have the following disadvantages; (i) in the above films, the internal stress is substantially twice as high as that in the TiN films: (ii) with a further increase in film thickness with the aim of improving wear resistance, the internal stress monotonically increases, thus often causing the generation of cracks and the peeling of the films. Accordingly the thickness of the (Ti, Al)N or (Ti, Hf)N films used has to be thinner than in the case of the TiN films, which prevents the full exploitation of their other excellent properties.

SUMMARY OF THE INVENTION

Taking the above circumstances into consideration, the present invention has been made, and its objective is to provide films superior in wear resistance to (Al, Ti)N films.

To achieve the above objective, in a preferred embodiment of the invention, there is provided a wear resistant film layer, made of a boronitride having a chemical composition of $(Al_xTi_{1-x})(B_yN_{1-y})$, where $0.05 \leq x \leq 0.75$ and $0.02 \leq y \leq 0.12$ and which is formed on the surface of a substrate to a thickness of 0.5 to 8 μm.

DETAILED DESCRIPTION OF THE PREFERRED EMBODIMENT

The film layer of the present invention is required to contain a boronitride having a chemical composition of $(Al_xTi_{1-x})(B_yN_{1-y})$, where $0.05 \leq x \leq 0.75$, and $0.02 \leq y \leq 0.12$. Preferably, the value of $<x>$ is within the range of $0.50 \leq x \leq 0.75$.

Hereinafter, the boronitride according to the present invention will be discussed making reference to the details of how the present invention has been accomplished.

First, the description will be made for a nitride system $\{(Al_xTi_{1-x})N\}$. This AlN-TiN solid solution has been examined for various compositions corresponding to various values of x. As a result, it was revealed that the internal stress (compressive stress) is $4.7 \times 10^{10}$ dyne/cm² on average for each composition of $x \leq 0.6$ in $(Al_xTi_{1-x})N$ $(0.05 \leq x)$ as compared with a value of $1.9 \times 10^{10}$ dyne/cm² for TiN. However, in the above nitride system, with a further increase in the AlN component, the internal stress is reduced and at the composition corresponding to $x = 0.7$ the crystal structure changes from the NaCl type (B1 structure) to the ZnS structure (wurtzite structure), and the internal stress abruptly decreases to value of $2.8 \times 10^{10}$ dyne/cm².

Figure 1:
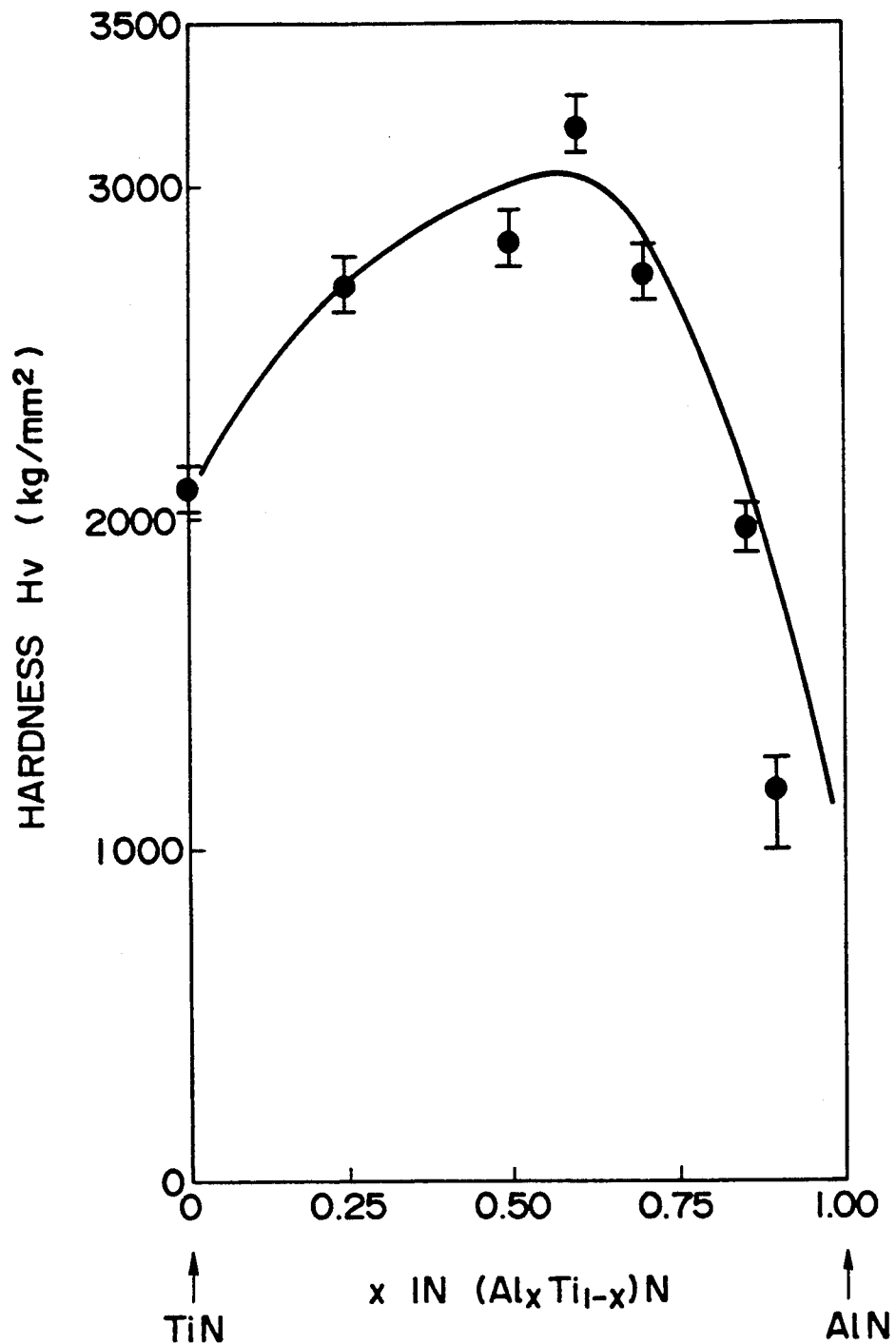
FIG. 1 is a graph showing the relationship between the value of $<x>$ in $(Al_xTi_{1-x})N$ and hardness.

FIG. 1 is a graph showing the dependence of the hardness on the value of $<x>$ in the film layer of $(Al_xTi_{1-x})N$. As is apparent from FIG. 1 with an increase in the value of $<x>$, the hardness increases. When the value of $<x>$ is 0.6, the hardness achieves the maximum value of Hv=3000 kg/mm². With a further increase in the value of $<x>$ from 0.6, the hardness decreases due to the change in crystal structure. Thus, when the value of $<x>$ becomes 0.75, the hardness is nearly similar to that of TiN. Further when the value of $<x>$ exceeds 0.75, the hardness is less than that of TiN. Namely, when the solubility (x) of AlN exceeds 0.75, the composition of the film layer approximates to that of AlN, resulting in softening of the film layer. Accordingly, the film layer is insufficient in hardness, and is susceptible to flank wear when it is used as a coating for cutting tools.

As a result, in the present invention, taking both the wear resistance and the internal stress into consideration, the value of $<x>$ (solubility of AlN) is specified to be within the range of between 0.05 and 0.75. Preferably, the value of $<x>$ is within the range of $0.50 \leq x \leq 0.75$.

Figure 2:
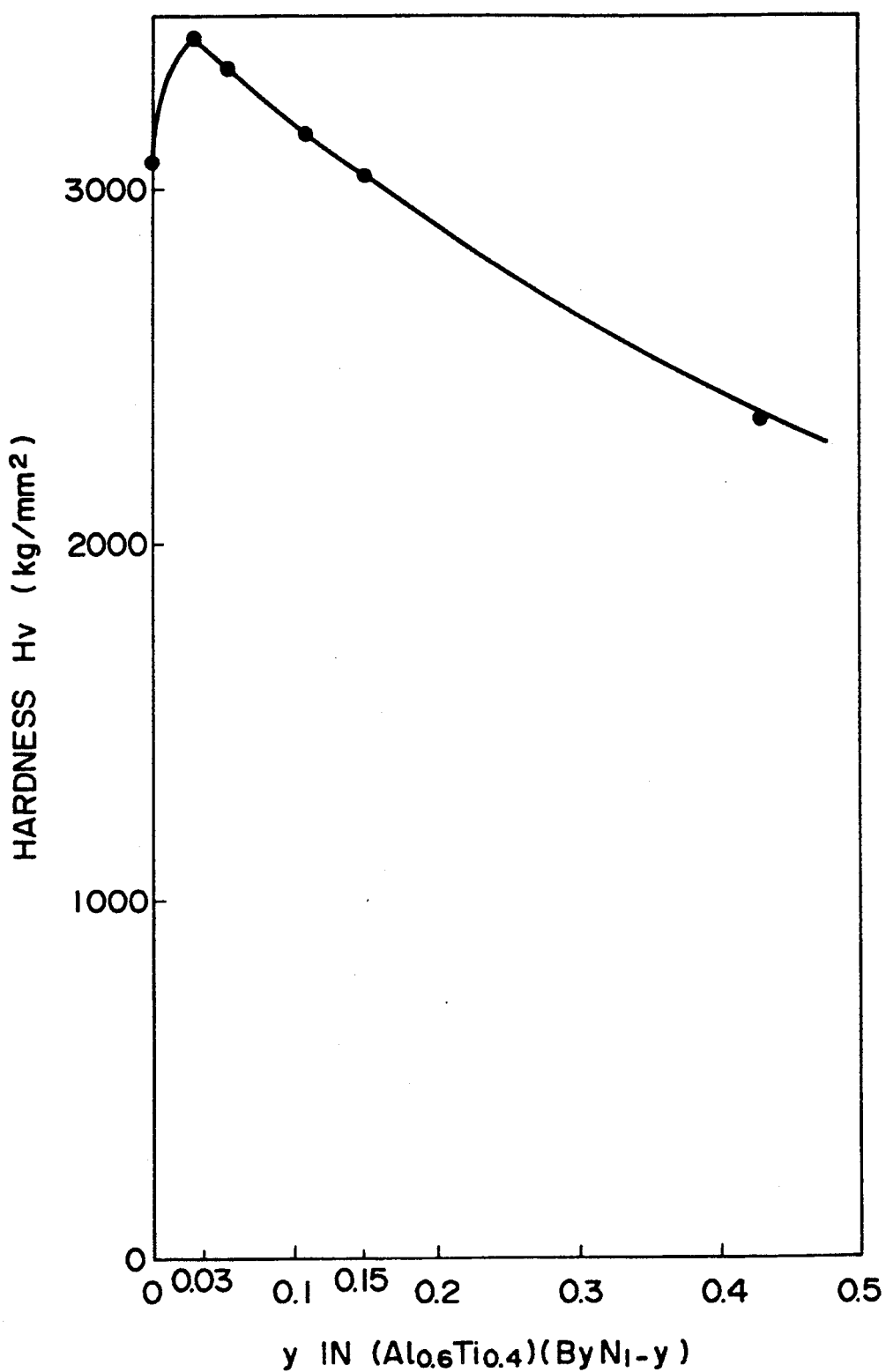
FIG. 2 is a graph showing the relationship between the value of $<y>$ in $(Al_{0.6}Ti_{0.4})(B_yN_{1-y})$ and hardness.

Further the present invention is intended to further increase the hardness of the film layer by the formation of a boronitride through addition of boron (B). With this objective, boron was added to the $(Al_xTi_{1-x})N$ system exhibiting the highest hardness as shown in FIG. 1, namely $(Al_{0.6}Ti_{0.4})N$. FIG. 2 shows the dependence of the hardness on the proportion of boron (denoted as y) in the $\{(Al_{0.6}Ti_{0.4})(B_yN_{1-y})\}$ system. As is apparent from this figure, for the $\{(Al_{0.6}Ti_{0.4})(B_yN_{1-y})\}$ system, the hardness increases with addition of B and reaches a maximum value of Hv=3400 kg/mm² at y=0.03 and then gradually decreases with further addition of B, and is nearly equal to the hardness of the base composition, that is, $(Al_{0.6}Ti_{0.4})N$ at y=0.15. X-ray diffraction measurements were carried out for the composition marked by points in FIG. 2 to examine the change in structure. With increase in boron content (y), it was observed that the intensity of the diffraction lines corresponding to the NaCl structure, which were strongly apparent for the base composition, was weakened at y=0.15 and the structure became perfectly amorphous at y=0.43. Similarly, an examination was made of the composition for various different values of $<x>$, which gave nearly the same result as described above. Consequently the value of $<y>$ is specified to be within the range between 0.02 and 0.12.

As a result of further examinations, such as practical cutting performance tests using a variety of substrates made of WC-based super hard alloys, TiCN cermets and ceramics, the following facts were revealed; (i) from the observation of the cutting edge, in the case of the (Al$_x$Ti1−$_x$)N coating (free of boron), a trace of iron was found to be fused on the cutting edge and the amount of this fused iron increased linearly with cutting time; (ii) in contrast, in the case of addition of B, the fusion of the iron was not observed substantially throughout the life of the tool. Accordingly, by the addition of B, it is possible to reduce the reactivity between the film and the iron work material and hence to obtain a film whose properties make it an excellent material for coated cutting tools.

In terms of wear resistance, the film thickness is required to be within the range of between 0.5 and 8 $\mu$m. For a film thickness of 0.5 $\mu$m or less, the wear resistance is insufficient. With an increase in the film thickness the wear resistance is enhanced. When it is more than 8 $\mu$m, the film layer is liable to become cracked, and becomes poor in terms of film strength.

The film formation method, by means of which the present invention is not limited to, preferably includes an ion-plating method using EB melting, arc discharge evaporation or the like, and sputtering. In other words the whole PVD method can be used to obtain the claimed films. The reason why the above PVD method or the like is preferable is that the processing temperature can be kept low and thus it is possible to form the films without harming the characteristics of the substrates. Accordingly, a radio frequency (rf) plasma CVD method capable of performing the coating at relatively low temperatures may also be adopted.

In addition, the following description will be made of an ion plating method by arc discharge with a cathode as an evaporation source.

In formation of the film layer of the present invention by the above ion plating method, cathode material is evaporated and ionized by the arc discharge, and is reacted with an $N_2$ atmosphere or an $N_2$-Ar mixed gas atmosphere, to thereby coat the substrate with the objective nitride. The element boron itself, in the case of which an arc discharge cannot be generated, cannot be used as the cathode material. For this reason the combination of (Al-B+Ti) or (Ti-B+Al), or the Al-Ti-B system having the composition corresponding to that of the film layer is used as the cathode material. In particular, an Al-Ti-B system having a homogenous composition is preferable, because it is easy to control the film composition. By performing the evaporation of each alloy component of the Ti-Al-B system using a large current of more than several tens of amperes, it is possible to perform the coating without causing any deviation in the composition of the cathode material. Also the evaporated species have high ionizing efficiency and reactivity, which makes it possible to obtain a film with excellent adhesion properties by applying a bias voltage to the substrate holder.

In practice of the present invention, as described above, the low temperature coating method is preferable for preventing the deterioration of the substrate. However in the cases where prevention of deterioration of the substrate is not so important, the following methods may be used: (1) coating by the general PVD method and then (2) performing the recrystallization of as-deposited film by heat treatment at a temperature greater than 800° C. for recovering the hardness and enhancing the adhesion of the film to the substrate. Also, in the present invention, a trace of carbon may be added to the film.

The present invention will be more clearly understood with reference to the following examples. However the examples are not intended as a definition of the limits of the present invention, and there are various possible modifications in design which should be considered to be within the technical scope of the present invention.

EXAMPLE 1

A cathode electrode having a composition of one of the variety of compositions of the Al-Ti-N-B system to be used, and a carbide insert, SNGN120416 (mainly containing WC-10% Co) was mounted on the substrate holder of an ion plating apparatus equipped with a cathode arc system. In addition, the above equipment was provided with a mechanism for rotating the substrate holder and a heater, for achieving homogeneity and for enhancing adhesion respectively of the wear resistant coating film.

For film formation a bias voltage of −70 V was applied to the substrate. At the same time, a high purity $N_2$ gas was introduced into the equipment to a pressure of $5 \times 10^{-2}$ Torr. Thus the arc discharge was started, to form the (Al$_x$Ti$_{1-x}$)(B$_y$N$_{1-y}$) film on the surface of the substrate.

For each film layer thus obtained, the layer thickness was measured and the layer composition determined. The measurement of the layer thickness was made by a method wherein one piece of one of the substrates simultaneously mounted on the substrate holder was broken and its fracture surface was observed by a scanning electron microscope. The determination of the layer composition was made by a method wherein each of the substrates simultaneously mounted on the substrate holder was subjected to a depth analysis by Auger electron spectroscopy.

In this way, the concentration of each component, namely Al, Ti, B, and N, was kept constant in the film thickness direction.

Further, each film layer was subjected to a cutting test for 25 mins. under the following cutting conditions and the flank wear was measured.

Cutting conditions:

| Work material | S50C (carbon steel) |
|---|---|
| Cutting speed | 170 m/min |
| Feed rate | 0.25 mm/rev |
| Depth of cut | 0.1 mm |

The results are shown in Table 1, wherein the sample nos. 1 to 5 are included as working examples and the sample nos. 6 to 8 are included as comparative examples.

TABLE 1

| No. | evaporation source composition (atomic %) | film composition (atomic %) | film thickness (μm) | flank wear width (mm) |
|---|---|---|---|---|
| Working example | | | | |
| 1 | $Al_{58.2}Ti_{38.8}B_3$ | $(Al_{57}Ti_{43})(B_{3.1}N_{96.9})$ | 3.2 | 0.07 |
| 2 | $Al_{57}Ti_{38}B_5$ | $(Al_{56}Ti_{44})(B_{5.3}N_{94.7})$ | 4.8 | 0.0 |
| 3 | $Al_{54}Ti_{36}B_{10}$ | $(Al_{61}Ti_{39})(B_{11.1}N_{88.9})$ | 6.5 | 0.09 |
| 4 | $Al_6Ti_{89}B_3$ | $(Al_{6.3}Ti_{93.7})(B_{5.3}N_{94.7})$ | 1.8 | 0.09 |
| 5 | $Al_{72}Ti_{24}B_4$ | $(Al_{74}Ti_{26})(B_{3.8}N_{96.2})$ | 5.0 | 0.05 |
| Comparative example | | | | |
| 6 | $Al_{60}Ti_{40}$ | $(Al_{63}Ti_{37})N$ | 4.3 | 0.14 |
| 7 | $Al_{42}Ti_{28}B_{30}$ | $(Al_{61}Ti_{39})(B_{43}N_{57})$ | 3.6 | 0.31 |
| 8 | $Al_{13}Ti_{67}B_{20}$ | $(Al_{15}Ti_{85})(B_{23}N_{77})$ | 5.2 | 0.25 |

As is apparent from Table 1, the sample nos. 1 to 5 included as working examples exhibit low flank wear widths, thus demonstrating their excellent wear resistance. On the other hand, the sample no. 6, included as a comparative example, which does not contain B, exhibits high flank wear width. Further, the sample nos. 7 and 8 also included as comparative examples, which include excessive amounts of B, also exhibit high flank wear width.

EXAMPLE 2

The film was formed under the same conditions as described in Example 1, except that TiCN based cermet inserts of SNMN120408 were used as the substrate.

Each film layer was then subjected to a milling test, under the following milling conditions;

Milling conditions:

| | |
|---|---|
| Work material | SCM 435 |
| Cutting speed | 200 m/min |
| Feed rate | 0.2 mm/rev |
| Depth of cut | 1.5 mm |
| Coolant | None used |

With respect to the sample nos. 9 to 11 (working examples) and the sample nos. 12 and 13 (comparative examples), the lifetimes of each sample are shown in Table 2, where the lifetime is defined as the cutting time elapsed when the wear width ($V_B$) reaches a value of 0.3 mm.

TABLE 2

| No. | evaporation source composition (atomic %) | film composition (atomic %) | film thickness (μm) | life (min) |
|---|---|---|---|---|
| Working example | | | | |
| 9 | $Al_{57}Ti_{38}B_5$ | $(Al_{55}Ti_{45})(B_4N_{96})$ | 4.5 | 65 |
| 10 | $Al_{54}Ti_{36}B_{10}$ | $(Al_{60}Ti_{40})(B_{10}N_{90})$ | 6.8 | 73 |
| 11 | $Al_6Ti_{89}B_5$ | $(Al_7Ti_{93})(B_6N_{94})$ | 1.3 | 55 |
| Comparative example | | | | |
| 12 | $Al_{60}Ti_{40}$ | $(Al_{62}Ti_{38})N$ | 4.5 | 40 |
| 13 | $Al_{13}Ti_{67}B_{20}$ | $(Al_{13}Ti_{37})(B_{20}N_{80})$ | 4.8 | 35 |

EXAMPLE 3

The film was formed under the same conditions as described in Example 1 except that ceramic inserts of SNGN 120408 ($Si_3N_4$ based) were used as the substrate.

Each film layer was then subjected to a cutting test under the following cutting conditions;

Cutting conditions:

| | |
|---|---|
| Work material | FC25 |
| Cutting speed | 300 m/min |
| Feed rate | 0.4 mm/rev |
| Depth of cut | 3 mm |
| Coolant | None used |

With respect to the sample nos. 14 to 16 (working examples) and the sample nos. 17 and 18 (comparative examples), the wear widths ($V_B$) after cutting for 30 mins are shown in Table 3.

TABLE 3

| No. | evaporation source composition (atomic %) | film composition (atomic %) | film thickness (μm) | wear width ($V_B$) |
|---|---|---|---|---|
| Working example | | | | |
| 14 | $Al_{57}Ti_{38}B_5$ | $(Al_{60}Ti_{40})(B_5N_{95})$ | 4.6 | 0.03 |
| 15 | $Al_{54}Ti_{36}B_{10}$ | $(Al_{58}Ti_{42})(B_9N_{91})$ | 6.4 | 0.03 |
| 16 | $Al_{72}Ti_{24}B_4$ | $(Al_{75}Ti_{25})(B_4N_{96})$ | 7.5 | 0.05 |
| Comparative example | | | | |
| 17 | $Al_{60}Ti_{40}$ | $(Al_{59}Ti_{41})N$ | 5.0 | 0.10 |
| 18 | $Al_{42}Ti_{28}B_{30}$ | $(Al_{63}Ti_{37})(B_{35}N_{65})$ | 4.0 | 0.31 |

EXAMPLE 4

Next a carbide based drills embodying the present invention will be described.

The film was formed under the same conditions as described in Example 1 except that carbide based drills (mainly containing WC-8% Co) having a diameter of 6 mm were used as the substrate.

The thus coated drills were then subject to a drilling test under the following drilling conditions;

Drilling conditions:

| | |
|---|---|
| Work material | S50C, 13 mm thick |
| Cutting speed | 50 m/min |
| Feed rate | 0.2 mm/rev |
| Lubrication | By emulsion |

With respect to the sample nos. 19 to 21 (working examples) and the sample nos. 22 to 24 (comparative examples), the film compositions, film thickness and the number of drilled holes

TABLE 4

| No. | film composition (atomic %) | film thickness (μm) | number of drilled holes |
|---|---|---|---|
| Working example | | | |
| 19 | $(Al_{58}Ti_{42})(B_5N_{95})$ | 4.5 | 9000 |
| 20 | $(Al_{65}Ti_{35})(B_{11}N_{89})$ | 7.0 | 8900 |
| 21 | $(Al_5Ti_{95})(B_3N_{97})$ | 5.3 | 7500 |
| Comparative example | | | |
| 22 | $(Al_{54}Ti_{46})N$ | 4.2 | 6800 |
| 23 | $(Al_{55}Ti_{45})(B_{20}N_{80})$ | 6.0 | 2100 |
| 24 | $(Al_{63}Ti_{37})(B_8N_{92})$ | 10.2 | 2000 |

EXAMPLE 5

Further, a carbide end mill embodying the present invention will be described. The film was formed under the same conditions as described in Example 1, except that carbide based two-flute end mills (mainly containing WC-10% Co) having a diameter of 10 mm ware used as the substrate.

The thus coated mill was then subjected to a cutting test under the following cutting conditions;

Cutting conditions:

| Work material | S50C |
|---|---|
| Cutting speed | 100 m/min |
| Feed rate | 410 m/min |
| Depth of cut | 1 mm (radial direction) |
| | 15 mm (axial direction) |
| Coolant | Air blow |

With respect to the sample nos. 25 and 26 (working examples) and the sample nos. 27 and 28 (comparative examples), the film compositions, film thicknesses and wear widths, after a 100 m length of the work material had been cut, are shown in Table 5.

TABLE 5

| No. | film composition (atomic %) | film thickness (μm) | wear width |
|---|---|---|---|
| | Working example | | |
| 25 | $(Al_{62}Ti_{38})(B_8N_{92})$ | 2.5 | 0.03 |
| 26 | $(Al_{10}Ti_{90})(B_3N_{97})$ | 3.5 | 0.04 |
| | Comparative example | | |
| 27 | $(Al_{51}Ti_{49})N$ | 4.0 | 0.20 |
| 28 | $(Al_{43}Ti_{57})(B_{20}N_{80})$ | 5.0 | 0.25 |

According to the present invention, it is possible to obtain films superior in wear resistance to the $(Al_xTi_{1-x})N$ films. Further, the films formed according to the present invention have the characteristic of having low reactivities with the iron work material.

What is claimed is:

1. A wear resistant coating film layer having high hardness, which is formed directly on the surface of a substrate, said film comprising a boronitride having the following chemical composition:

$$(Al_xTi_{1-x})(B_yN_{1-y})$$

where
$0.05 \leq x \leq 0.75$
$0.02 \leq y \leq 0.12$
wherein the thickness of said film layer is within the range of from 0.5 to 8 μm.

2. A wear resistant film coated cutting tool comprising a WC-based super hard alloy, TiCN-based cermet or ceramic as substrate, the surface of which is coated with said hard film layer of claim 1.

* * * * *